(12) United States Patent
Lin et al.

(10) Patent No.: US 12,363,979 B2
(45) Date of Patent: *Jul. 15, 2025

(54) NANOSHEET FIELD-EFFECT TRANSISTOR DEVICE INCLUDING MULTI-LAYER SPACER FILM AND METHOD OF FORMING

(71) Applicant: Taiwan Semiconductor Manufacturing Co., Ltd., Hsinchu (TW)

(72) Inventors: Wen-Kai Lin, Hsinchu (TW); Yung-Cheng Lu, Hsinchu (TW); Che-Hao Chang, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/660,461

(22) Filed: May 10, 2024

(65) Prior Publication Data

US 2024/0297237 A1 Sep. 5, 2024

Related U.S. Application Data

(63) Continuation of application No. 18/303,841, filed on Apr. 20, 2023, now Pat. No. 12,009,407, which is a (Continued)

(51) Int. Cl.
*H10D 64/01* (2025.01)
*H01L 21/02* (2006.01)
(Continued)

(52) U.S. Cl.
CPC ....... *H10D 64/018* (2025.01); *H01L 21/0259* (2013.01); *H01L 21/31116* (2013.01);
(Continued)

(58) Field of Classification Search
CPC .......... H01L 21/0259; H01L 21/31116; H01L 21/823431; H01L 21/823468;
(Continued)

(56) References Cited

U.S. PATENT DOCUMENTS 9,209,247 B2 12/2015 Colinge et al.
9,224,833 B2 12/2015 Chen et al.
(Continued)

FOREIGN PATENT DOCUMENTS

CN 109216454 A 1/2019
CN 109904156 A 6/2019
(Continued)

*Primary Examiner* — Cheung Lee
(74) *Attorney, Agent, or Firm* — Slater Matsil, LLP

(57) ABSTRACT

A method of forming a semiconductor device includes: forming a dummy gate structure over a nanostructure, where the nanostructure overlies a fin that protrudes above a substrate, where the nanostructure comprises alternating layers of a first semiconductor material and a second semiconductor material; forming openings in the nanostructure on opposing sides of the dummy gate structure, the openings exposing end portions of the first semiconductor material and end portions of the second semiconductor material; recessing the exposed end portions of the first semiconductor material to form first sidewall recesses; filling the first sidewall recesses with a multi-layer spacer film; removing at least one sublayer of the multi-layer spacer film to form second sidewall recesses; and forming source/drain regions in the openings after removing at least one sublayer, where the source/drain regions seal the second sidewall recesses to form sealed air gaps.

20 Claims, 11 Drawing Sheets

Related U.S. Application Data continuation of application No. 17/238,656, filed on Apr. 23, 2021, now Pat. No. 11,664,441.

(60) Provisional application No. 63/065,126, filed on Aug. 13, 2020.

(51) Int. Cl.

| | | |
|---|---|---|
| *H01L 21/311* | (2006.01) | |
| *H10D 30/01* | (2025.01) | |
| *H10D 30/67* | (2025.01) | |
| *H10D 62/00* | (2025.01) | |
| *H10D 62/10* | (2025.01) | |
| *H10D 64/66* | (2025.01) | |
| *H10D 84/01* | (2025.01) | |
| *H10D 84/03* | (2025.01) | |

(52) U.S. Cl.
CPC ......... *H10D 30/024* (2025.01); *H10D 30/031* (2025.01); *H10D 30/6713* (2025.01); *H10D 30/6735* (2025.01); *H10D 30/6739* (2025.01); *H10D 30/6757* (2025.01); *H10D 62/021* (2025.01); *H10D 62/118* (2025.01); *H10D 64/017* (2025.01); *H10D 64/021* (2025.01); *H10D 64/671* (2025.01); *H10D 64/679* (2025.01); *H10D 84/0158* (2025.01); *H10D 84/038* (2025.01)

(58) Field of Classification Search
CPC ............. H01L 29/0653; H01L 29/0665; H01L 29/0673; H01L 29/0847; H01L 29/42392; H01L 29/4908; H01L 29/4983; H01L 29/4991; H01L 29/66439; H01L 29/66545; H01L 29/66553; H01L 29/6656; H01L 29/66636; H01L 29/66742; H01L 29/66795; H01L 29/775; H01L 29/78618; H01L 29/78696; H10D 64/021; H10D 84/01; H10D 84/0158; H10D 84/038

See application file for complete search history.

(56) References Cited

U.S. PATENT DOCUMENTS

| | | |
|---|---|---|
| 9,251,888 B1 | 2/2016 | Liaw |
| 11,211,495 B2 | 12/2021 | Jeong et al. |
| 11,664,441 B2 | 5/2023 | Lin et al. |
| 2015/0048442 A1 | 2/2015 | Colinge et al. |
| 2015/0303270 A1 | 10/2015 | Liaw |
| 2018/0331232 A1 | 11/2018 | Frougier et al. |
| 2019/0006485 A1 | 1/2019 | Kim et al. |
| 2019/0058052 A1 | 2/2019 | Frougier et al. |
| 2020/0052086 A1 | 2/2020 | Yang et al. |
| 2020/0220006 A1 | 7/2020 | Yang et al. |
| 2024/0021730 A1 | 1/2024 | Jeong et al. |

FOREIGN PATENT DOCUMENTS

| | | |
|---|---|---|
| KR | 20190002005 A | 1/2019 |
| KR | 20190068312 A | 6/2019 |
| TW | 201912564 A | 4/2019 |
| TW | 201913754 A | 4/2019 |
| TW | 201924051 A | 6/2019 |

NANOSHEET FIELD-EFFECT TRANSISTOR DEVICE INCLUDING MULTI-LAYER SPACER FILM AND METHOD OF FORMING

PRIORITY CLAIM AND CROSS-REFERENCE

This application is a continuation of U.S. patent application Ser. No. 18/303,841, filed Apr. 20, 2023, entitled "Nanosheet Field-Effect Transistor Device and Method of Forming," which is a continuation of U.S. patent application Ser. No. 17/238,656, filed Apr. 23, 2021, entitled "Nanosheet Field-Effect Transistor Device and Method of Forming," now U.S. Pat. No. 11,664,441, issued May 30, 2023, which claims the benefit of U.S. Provisional Application No. 63/065,126, filed on Aug. 13, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
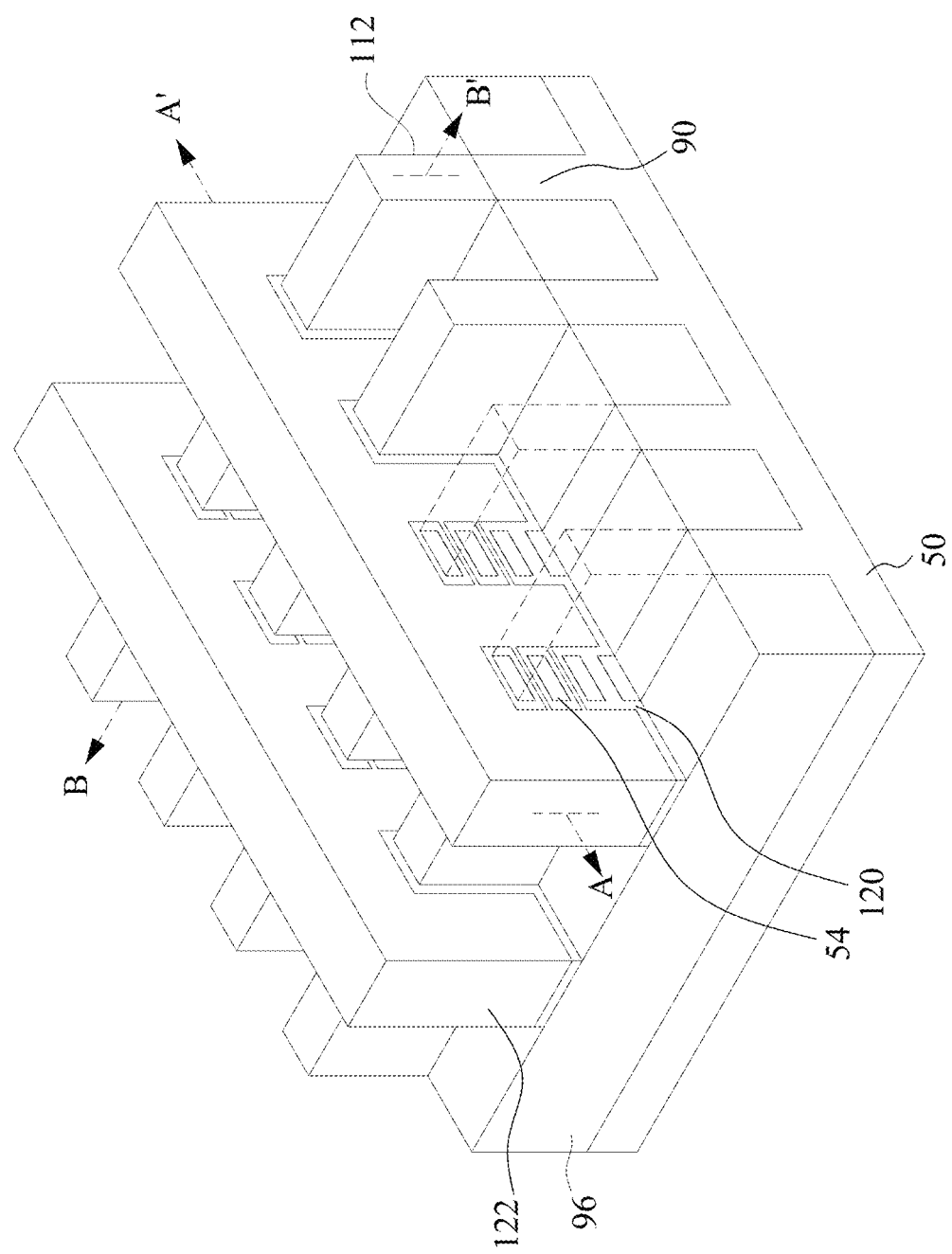
FIG. 1 illustrates an example of a nanosheet field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numerals in different figures refer to the same or similar component formed by a same or similar process using a same or similar material(s).

In accordance with some embodiments, a method of forming a semiconductor device includes: forming a dummy gate structure over a nanostructure, wherein the nanostructure overlies a fin that protrudes above a substrate, where the nanostructure comprises alternating layers of a first semiconductor material and a second semiconductor material; forming openings in the nanostructure on opposing sides of the dummy gate structure, the openings exposing end portions of the first semiconductor material and end portions of the second semiconductor material; recessing the exposed end portions of the first semiconductor material to form first sidewall recesses; filling the first sidewall recesses with a multi-layer spacer film; removing at least one sublayer of the multi-layer spacer film to form second sidewall recesses; and forming source/drain regions in the openings after removing at least one sublayer, wherein the source/drain regions seal the second sidewall recesses to form sealed air gaps. The sealed air gaps help to reduce the parasitic capacitance of the device formed.

FIG. 1 illustrates an example of a nanosheet field-effect transistor (NSFET) device in a three-dimensional view, in accordance with some embodiments. The NSFET device comprises semiconductor fins 90 (also referred to as fins) protruding above a substrate 50. A gate electrode 122 (e.g., a metal gate) is disposed over the fins, and source/drain regions 112 are formed on opposing sides of the gate electrode 122. A plurality of nanosheets 54 are formed over the fins 90 and between source/drain regions 112. Isolation regions 96 are formed on opposing sides of the fins 90. A gate dielectric layer 120 is formed around the nanosheets 54. Gate electrodes 122 are over and around the gate dielectric layer 120.

FIG. 1 further illustrates reference cross-sections that are used in later figures. Cross-section A-A' is along a longitudinal axis of a gate electrode 122 and in a direction, for example, perpendicular to the direction of current flow between the source/drain regions 112 of an NSFET device. Cross-section B-B' is perpendicular to cross-section A-A' and is along a longitudinal axis of a fin and in a direction of, for example, a current flow between the source/drain regions 112 of the NSFET device. Subsequent figures refer to these reference cross-sections for clarity.

FIGS. 2, 3A, 3B, 4A, 4B, 5A, 5B, 6-11, 12A, 12B, and 13-15 are cross-sectional views of a nanosheet field-effect transistor (NSFET) device 100 at various stages of manufacturing, in accordance with an embodiment.

Figure 2:
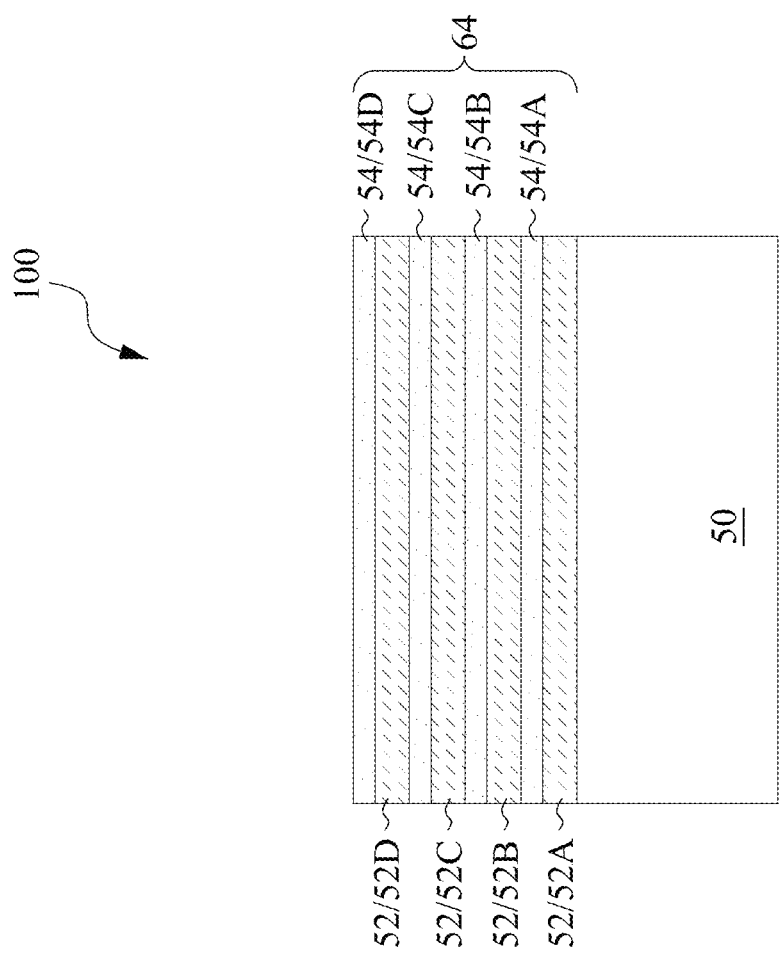
FIGS. 2, 3A, 3B, 4A, 4B, 5A, 5B, 6-11, 12A, 12B, and 13-14 are cross-sectional views of a nanosheet field-effect transistor device at various stages of manufacturing, in accordance with an embodiment.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, 52C, and 52D, and layers formed by the second semiconductor material 54 are labeled as 54A, 54B, 54C, and 54D. The number of layers formed by the first and the second semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material suitable for forming channel regions of, e.g., p-type FETs, such as silicon germanium ($Si_xGe_{1-x}$, where x can be in the range of 0 to 1), and the second semiconductor material 54 is an epitaxial material suitable for forming channel regions of, e.g., n-type FETs, such as silicon. The multi-layer stacks 64 (may also be referred to as an epitaxial material stack) will be patterned to form channel regions of an NSFET in subsequent processing. In particular, the multi-layer stacks 64 will be patterned to form horizontal nanosheets, with the channel regions of the resulting NSFET including multiple horizontal nanosheets.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

Figure 3B:
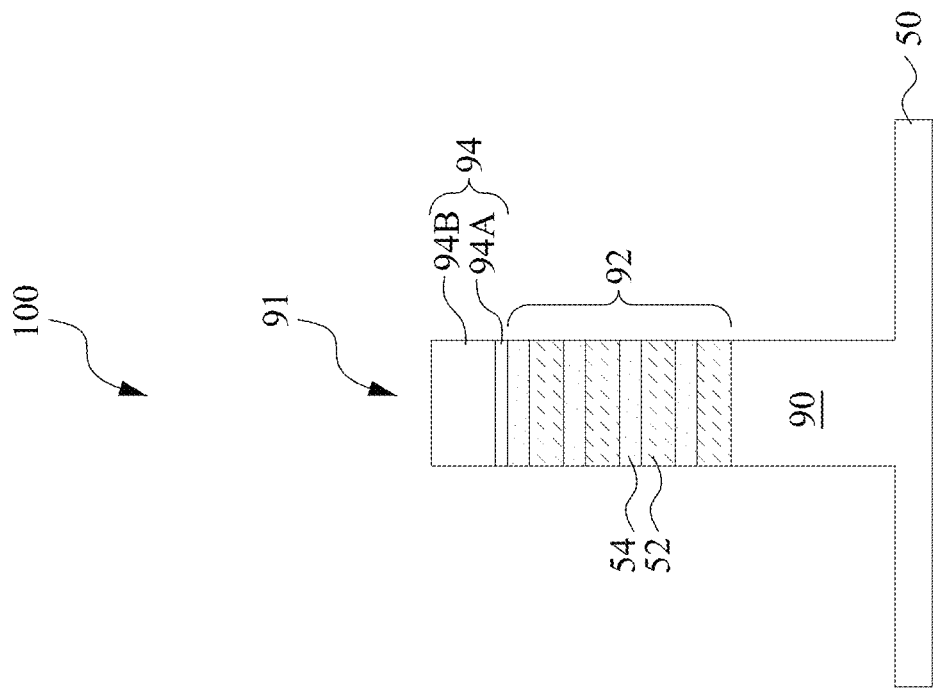

FIGS. 3A, 3B, 4A, 4B, 5A, 5B, 6-11, 12A, 12B, and 13-14 are cross-sectional views of the NSFET device 100 at subsequent stages of manufacturing, in accordance with an embodiment. FIGS. 3A, 4A, 5A, 6-11, 12A, and 13-14 are cross-sectional views along cross-section B-B' in FIG. 1. FIGS. 3B, 4B, and 5B are cross-sectional views along cross-section A-A' in FIG. 1. FIG. 12B is a zoomed-in view of a portion of the NSFET device 100 illustrated in FIG. 12A. Although one fin and one gate structure are illustrated in the figures as a non-limiting example, it should be appreciated that other numbers of fins and other numbers of gate structures may also be formed.

Figure 3A:
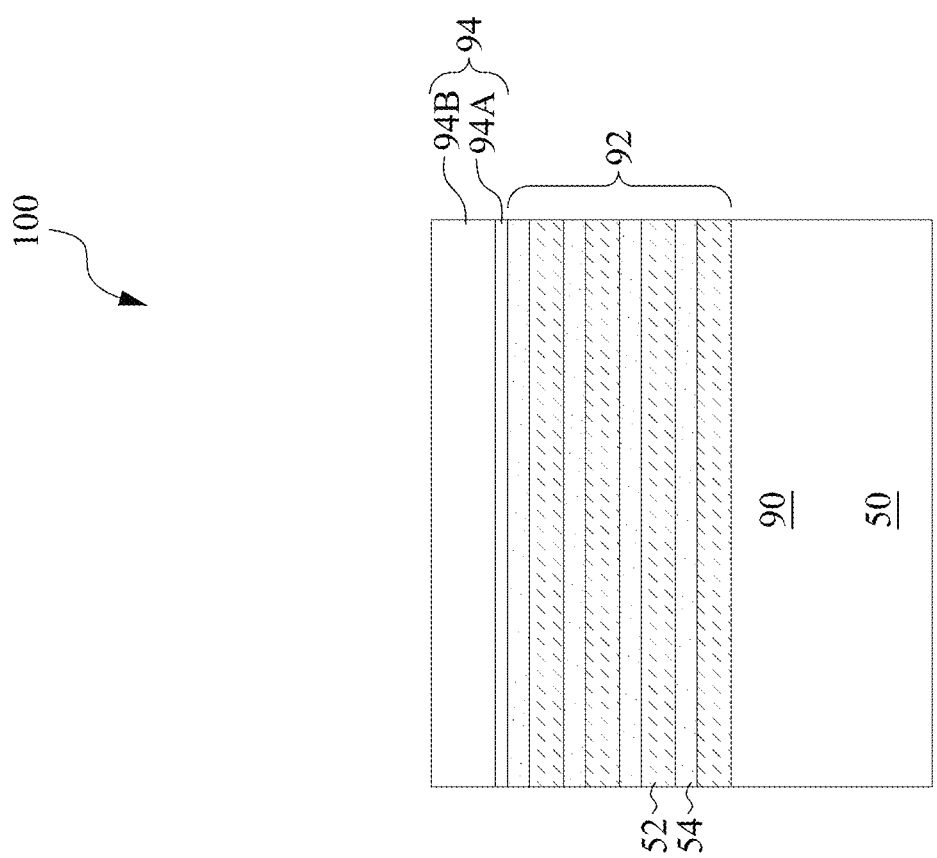
Figure 4B:
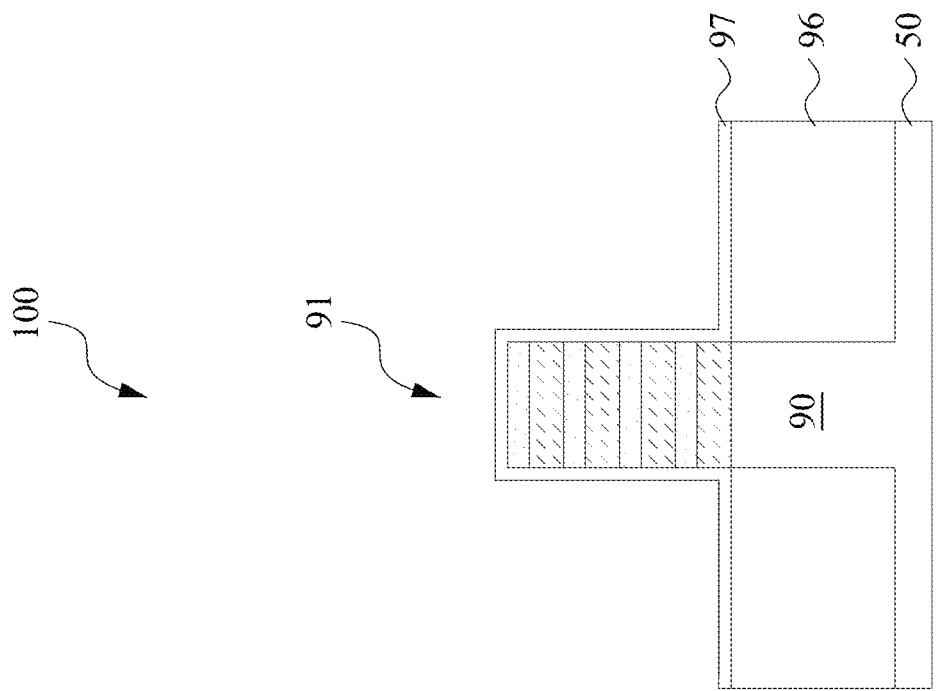

In FIGS. 3A and 3B, a fin structure 91 are formed protruding above the substrate 50. The fin structure 91 includes a semiconductor fin 90 and a nanostructure 92 overlying the semiconductor fin 90. The nanostructure 92 and the semiconductor fin 90 may be formed by etching trenches in the multi-layer stack 64 and the substrate 50, respectively.

The fin structure 91 may be patterned by any suitable method. For example, the fin structure 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fin structure 91.

In some embodiments, the remaining spacers are used to pattern a mask 94, which is then used to pattern the fin structure 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 form the nanostructure 92, and the patterned substrate 50 form the semiconductor fin 90, as illustrated in FIGS. 3A and 3B. Therefore, in the illustrated embodiment, the nanostructure 92 also includes alternating layers of the first semiconductor material 52 and the second semiconductor material 54, and the semiconductor fin 90 is formed of a same material (e.g., silicon) as the substrate 50.

Figure 4A:
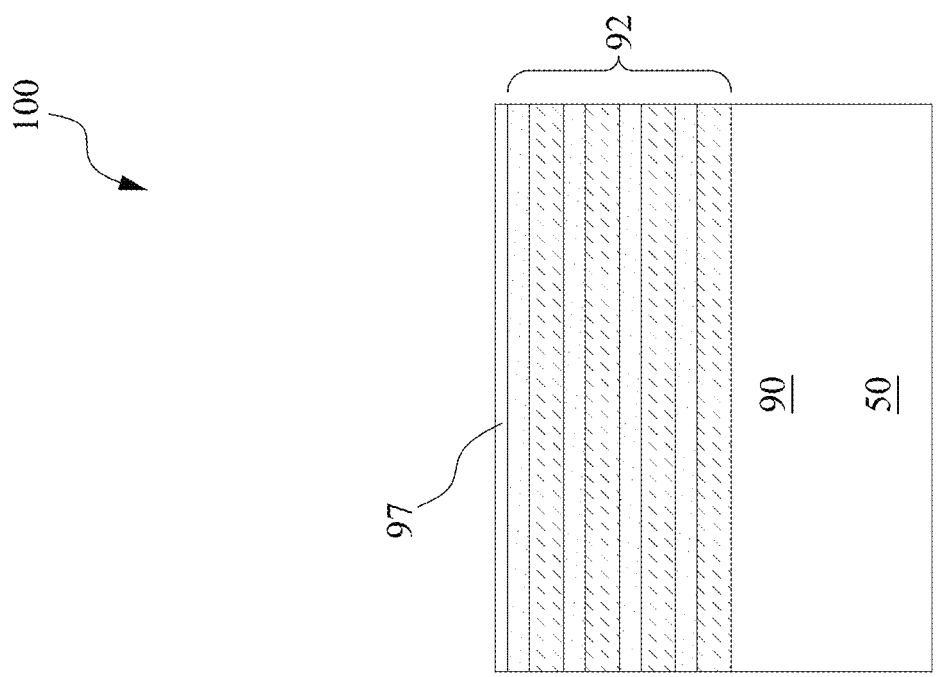
Figure 5B:
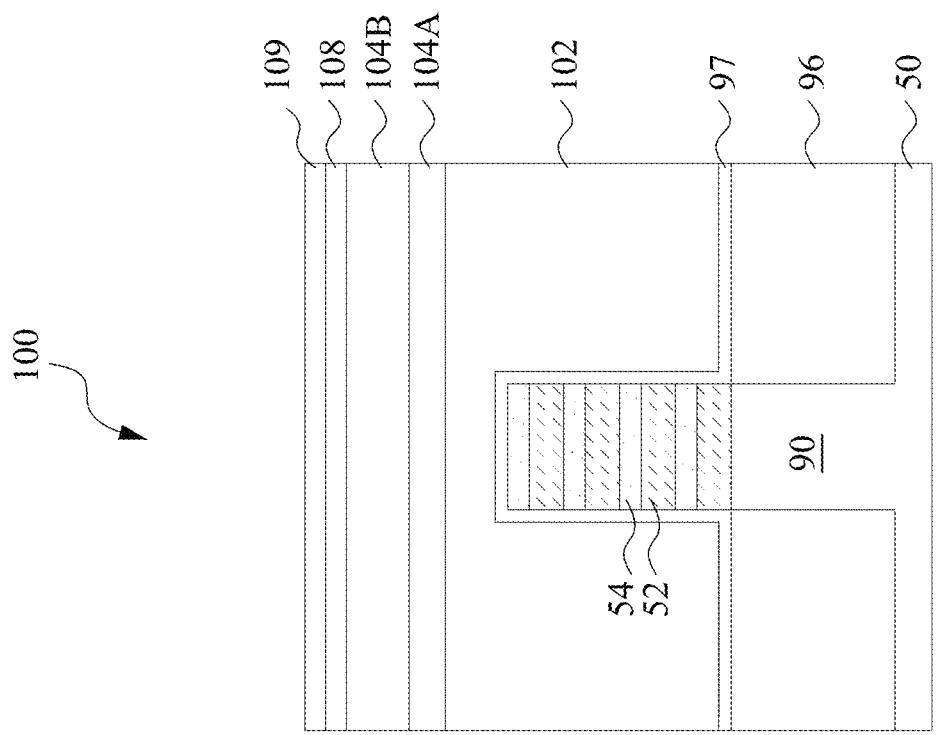

Next, in FIGS. 4A and 4B, Shallow Trench Isolation (STI) regions 96 are formed over the substrate 50 and on opposing sides of the fin structure 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed after the insulation material is formed.

In an embodiment, the insulation material is formed such that excess insulation material covers the fin structure 91. In some embodiments, a liner is first formed along surfaces of the substrate 50 and fin structure 91, and a fill material, such as those discussed above is formed over the liner. In some embodiments, the liner is omitted.

Next, a removal process is applied to the insulation material to remove excess insulation material over the fin structure 91. In some embodiments, a planarization process such as a chemical mechanical polish (CMP), an etch back process, combinations thereof, or the like may be utilized. The planarization process exposes the nanostructure 92 such that top surfaces of the nanostructure 92 and the insulation material are level after the planarization process is complete. Next, the insulation material is recessed to form the STI regions 96. The insulation material is recessed such that the nanostructure 92 protrudes from between neighboring STI regions 96. Top portions of the semiconductor fin 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor fins 90 and the nanostructures 92). For example, a chemical oxide removal with a suitable etchant such as dilute hydrofluoric (dHF) acid may be used.

Still referring to FIGS. 4A and 4B, a dummy dielectric layer 97 is formed over the nanostructure 92 and over the STI region 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the nanostructure 92 and over the upper surface of the STI regions 96, and a thermal oxidization process is performed to convert the deposited silicon layer into an oxide layer as the dummy dielectric layer 97.

Figure 5A:
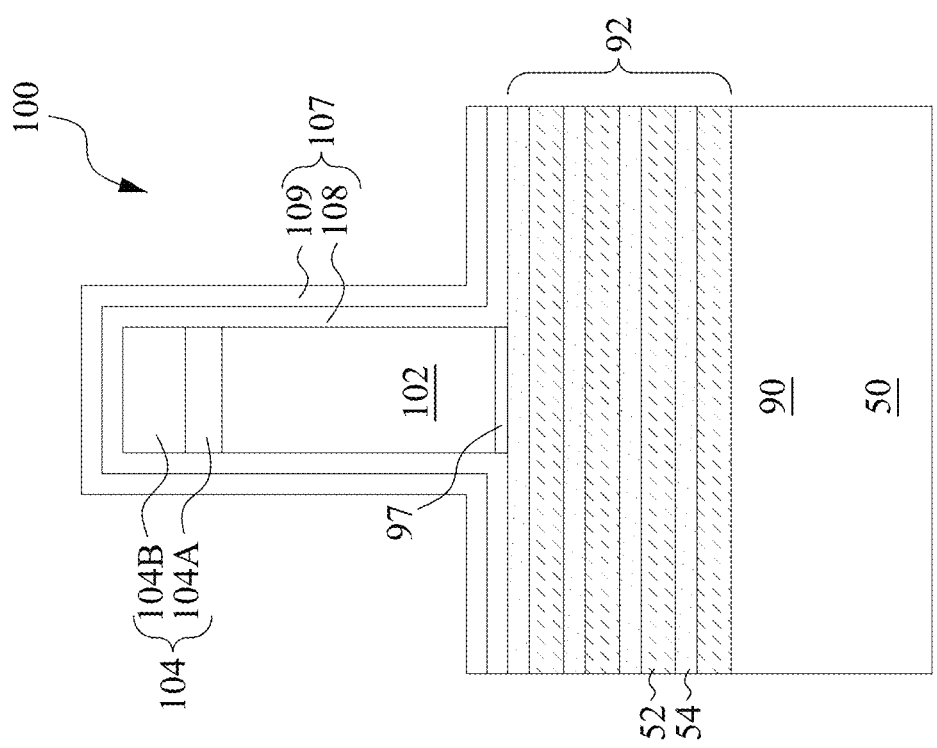

Next, in FIGS. 5A and 5B, a dummy gate 102 are formed over the fin 90 and over the nanostructure 92. To form the dummy gate 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gate 102, and then transferred to the dummy dielectric layer by acceptable etching technique to form dummy gate dielectrics 97. The dummy gate 102 cover respective channel regions of the nanostructures 92. The pattern of the masks 104 may be used to physically separate the dummy gate 102 from adjacent dummy gates. The dummy gate 102 may also have a lengthwise direction substantially perpendicular to the lengthwise direction of the fins 90. The dummy gate 102 and the dummy gate dielectric 97 are collectively referred to as dummy gate structure, in some embodiments.

Next, a gate spacer layer 107 is formed by conformally depositing an insulating material over the nanostructure 92, the STI regions 96, and the dummy gate 102. The insulating material may be silicon nitride, silicon carbonitride, a combination thereof, or the like. In some embodiments, the gate spacer layer 107 includes multiple sublayers. For example, a first sublayer 108 (sometimes referred to as a gate seal spacer layer) may be formed by thermal oxidation or a deposition, and a second sublayer 109 (sometimes referred to as a main gate spacer layer) may be conformally deposited on the first sublayer 108. FIG. 5B illustrates cross-sectional views of the NSFET device 100 in FIG. 5A, but along cross-section A-A' in FIG. 1.

Figure 6:
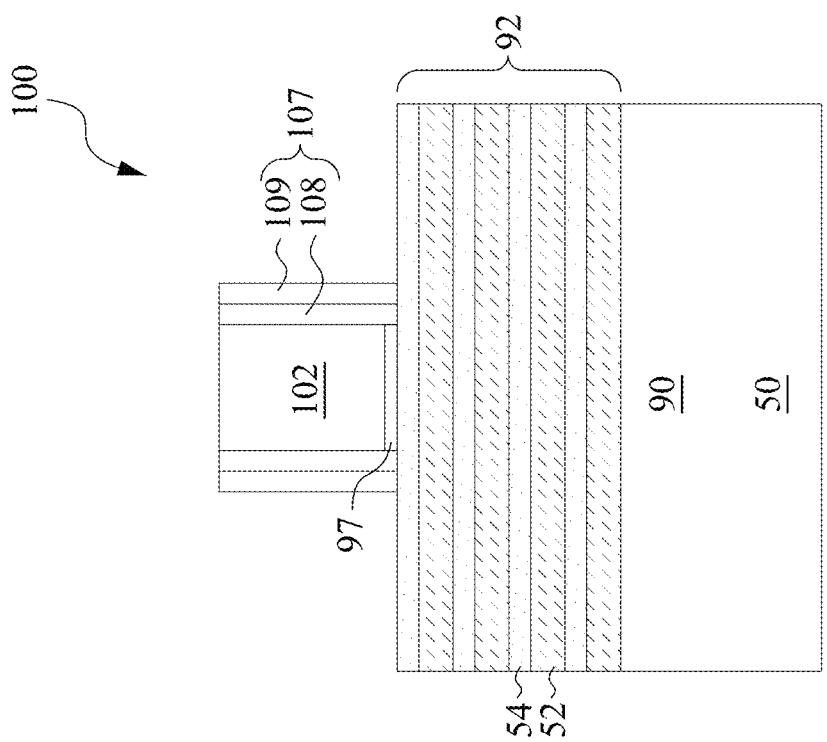

Next, in FIG. 6, the gate spacer layer 107 is etched by an anisotropic etching process to form gate spacers 107. The anisotropic etching process may remove horizontal portions of the gate spacer layer 107 (e.g., portions over the STI regions 96 and the dummy gate 102), with remaining vertical portions of the gate spacer layer 107 (e.g., along sidewalls of the dummy gate 102 and the dummy gate dielectric 97) forming the gate spacers 107.

After the formation of the gate spacers 107, implantation for lightly doped source/drain (LDD) regions (not shown) may be performed. Appropriate type (e.g., p-type or n-type) impurities may be implanted into the exposed nanostructure 92 and/or the semiconductor fin 90. The n-type impurities may be the any suitable n-type impurities, such as phosphorus, arsenic, antimony, or the like, and the p-type impurities may be the any suitable p-type impurities, such as boron, $BF_2$, indium, or the like. The lightly doped source/drain regions may have a concentration of impurities of from about $10^{15}$ cm$^{-3}$ to about $10^{16}$ cm$^{-3}$. An anneal process may be used to activate the implanted impurities.

Figure 7:
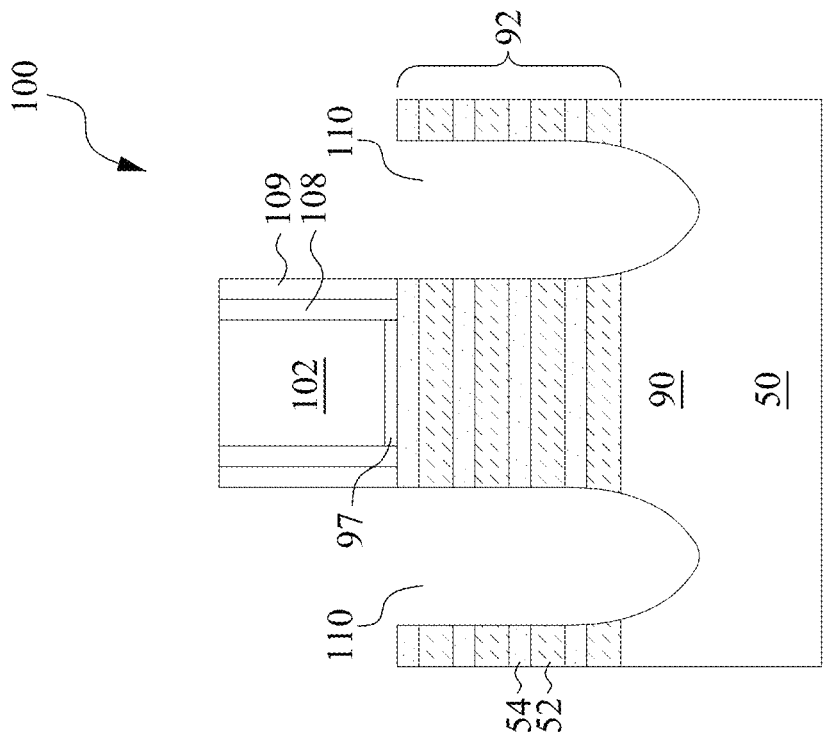

Next, in FIG. 7, openings 110 (may also be referred to as recesses) are formed in the nanostructure 92. The openings 110 may extend through the nanostructure 92 and into the semiconductor fin 90. The openings 110 may be formed by any acceptable etching technique, using, e.g., the dummy gate 102 as an etching mask. The openings 110 exposes end portions of the first semiconductor material 52 and end portions of the second semiconductor material 54.

Figure 8:
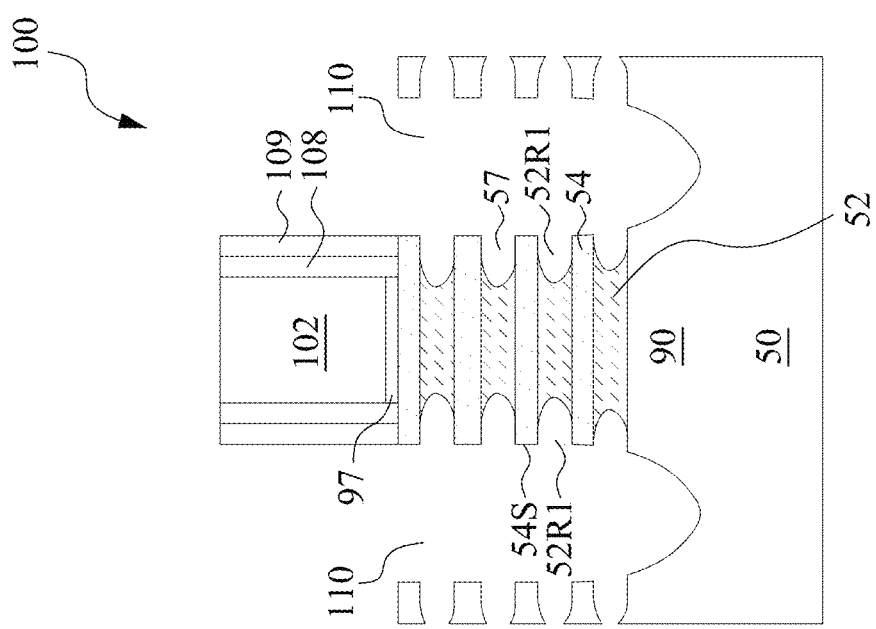

Next, in FIG. 8, after the openings 110 are formed, a selective etching process (e.g., a wet etch process using an etching chemical) is performed to recess end portions of the first semiconductor material 52 exposed by the openings 110 without substantially attacking the second semiconductor material 54. After the selective etching process, recesses 52R1 are formed in the first semiconductor material 52 at locations where the removed end portions used to be. Note that due to the recesses 52R1, sidewalls of the first semiconductor material 52 are recessed from sidewalls 54S of the second semiconductor material 54, and therefore, the recesses 52R1 may also be referred to as sidewall recesses 52R1 (or first sidewall recesses 52R1).

Figure 9:
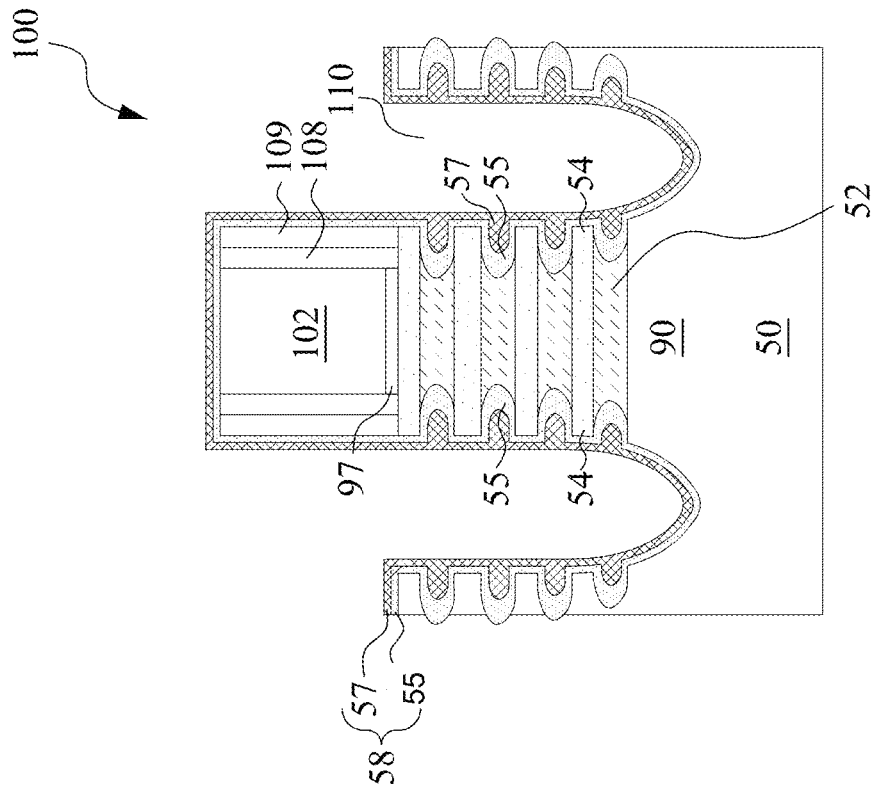

Next, in FIG. 9, a multi-layer spacer film 58 is formed in the openings 110 and fills the sidewall recesses 52R1. In the non-limiting example of FIG. 9, the multi-layer spacer film 58 includes a first dielectric layer 55 (also referred to as a first spacer layer) and a second dielectric layer 57 (also referred to as a second spacer layer) different from the first dielectric layer 55. In the illustrated embodiment, the first dielectric layer 55 is formed (e.g., conformally) in the openings 110 and in the sidewall recesses 52R1, and the second dielectric layer 57 is formed (e.g., conformally) over the first dielectric layer 55. Notably, the second dielectric layer 57 fills (e.g., completely fills) the sidewall recesses 52R1.

In some embodiments, the first dielectric layer 55 is a first dielectric material having a first dielectric constant, and the second dielectric layer 57 is a second dielectric material having a second dielectric constant smaller than that of the first dielectric material. The first dielectric constant is between about 5.0 and about 7.0, and the second dielectric constant is between about 4.2 and about 5.7, in an example embodiment. In some embodiments, an atomic percentage of oxygen in the first dielectric layer 55 is lower than an atomic percentage of oxygen in the second dielectric layer 57. For example, the atomic percentage of oxygen in the first dielectric layer 55 may be less than about 30 atomic percentage (at %), and the atomic percentage of oxygen in the second dielectric layer 57 may be between about 30 at % and about 60 at %. A lower dielectric constant, and/or a higher atomic percentage of oxygen in the second dielectric layer 57 may correspond to a higher etch rate than the first dielectric layer 55 in a subsequent selective etching process to form inner spacers 55 (see FIG. 11), and therefore, may provide the etching selectivity for the subsequent selective etching process. In addition, or alternatively, the first dielectric layer 55 may be formed of a dielectric material having a higher density (e.g., between about 2.5 g/cm$^3$ and about 2.9 g/cm$^3$) than the second dielectric layer 57 (e.g., having density between about 2.0 g/cm$^3$ and about 2.4 g/cm$^3$), such that the first dielectric layer 55 is etched (e.g., removed) at a slower rate than the second dielectric layer 57 in the subsequent selective etching process. For example, the first dielectric layer 55 may be a carbon-rich (e.g., having an atomic percentage of carbon between about 5 at % and about 20 at %) dielectric material, and/or a nitrogen-rich (e.g., having an atomic percentage of nitrogen between about 25 at % and about 45 at %) dielectric material.

The first dielectric layer 55 may be, e.g., silicon carbon nitride (SiCN), silicon nitride (SiN), silicon carbon oxynitride (SiCON), and the second dielectric layer 57 may be, e.g., silicon carbon oxynitride (SiCON), silicon oxynitride (SiON), or silicon carbon oxide (SiCO). In some embodiments, the first dielectric layer 55 and the second dielectric layer 57 are both formed of SiCON, but the atomic percentage of carbon (C at %) and/or the atomic percentage of nitrogen (N at %) in the first dielectric layer 55 and the second dielectric layer 57 are different to provide etching selectivity in the subsequent etching process. The first dielectric layer 55 and the second dielectric layer 57 may each be formed by a suitable formation method, such as atomic layer deposition (ALD). In an example embodiment, a highly conformal deposition process, such as thermal ALD with a deposition conformity larger than or equal to 95% for an opening with an aspect ratio larger than 20, is used to form the first dielectric layer 55 and the second dielectric layer 57. A temperature of the conformal deposition process may be between about 500° C. and about 680° C., as an example.

FIG. 9 shows the multi-layer spacer film 58 as having two dielectric layers (e.g., 55 and 57) as a non-limiting example. The multi-layer spacer film 58 may have more than two different dielectric layers (e.g., having two to four different dielectric layers), with each of the dielectric layers formed of a material same as or similar to that of the first dielectric layer 55 or the second dielectric layer 57. In some embodiments where the multi-layer spacer film 58 has more than two different dielectric layers formed successively in the openings 110, a dielectric layer formed early in the openings 110 may have a higher dielectric constant, a lower atomic percentage of oxygen, and/or a higher density than another dielectric layer formed later in the openings 110. Such a choice of the materials for the multi-layer spacer film 58 may advantageously provide the etching selectivity in the subsequent selective etching process for forming the inner spacers (see 55 in FIG. 11).

Figure 10:
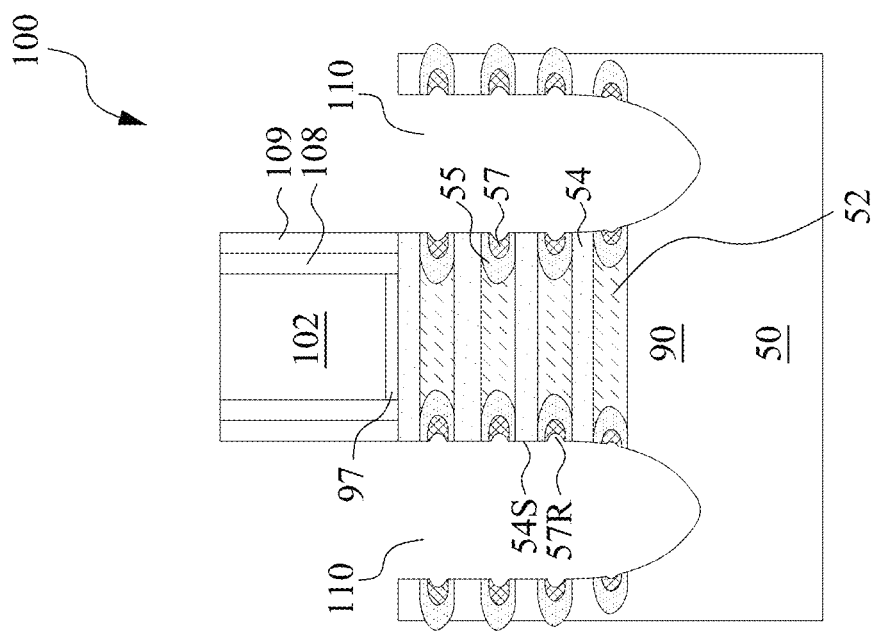

Next, in FIG. 10, a trimming process (also referred to an inner-spacer trimming process) is performed to remove (e.g., completely remove) portions of the multi-layer spacer film 58 disposed outside the sidewall recesses 52R1, such as portions along sidewalls and bottoms of the openings 110 and portions along the upper surface of the dummy gate 102. After the trimming process, portions of the multi-layer spacer film 58 inside the sidewall recesses 52R1 remain.

In some embodiments, the trimming process is a suitable etching process, such as a dry etch process or a wet etch process. In an example embodiment, a dry etch process using a gas source comprising a mixture of $CHF_3$ and $O_2$, a mixture of $CF_4$ and $O_2$, a mixture of $NF_3$, $CH_3F$, and $CHF_3$, or the like, is performed to remove portions of the multi-layer spacer film 58 disposed outside the sidewall recesses 52R1. Parameters of the dry etch process, such as the mixing ratio between the gases in the gas source, the pressure, and/or the flow rates of the gases, are tuned to adjust a lateral etching rate of the dry etch process. In the example of FIG. 10, after the trimming process, sidewalls of the remaining portions of the second dielectric layer 57 are recessed from the sidewalls 54S of the second semiconductor material 54 to form recesses 57R. In other embodiments, sidewalls of the remaining portions of the second dielectric layer 57 are flush with the sidewalls 54S, or extend toward the openings 110 beyond the sidewalls 54S of the second semiconductor material 54. These and other variations are fully intended to be included within the scope of the present disclosure.

Figure 11:
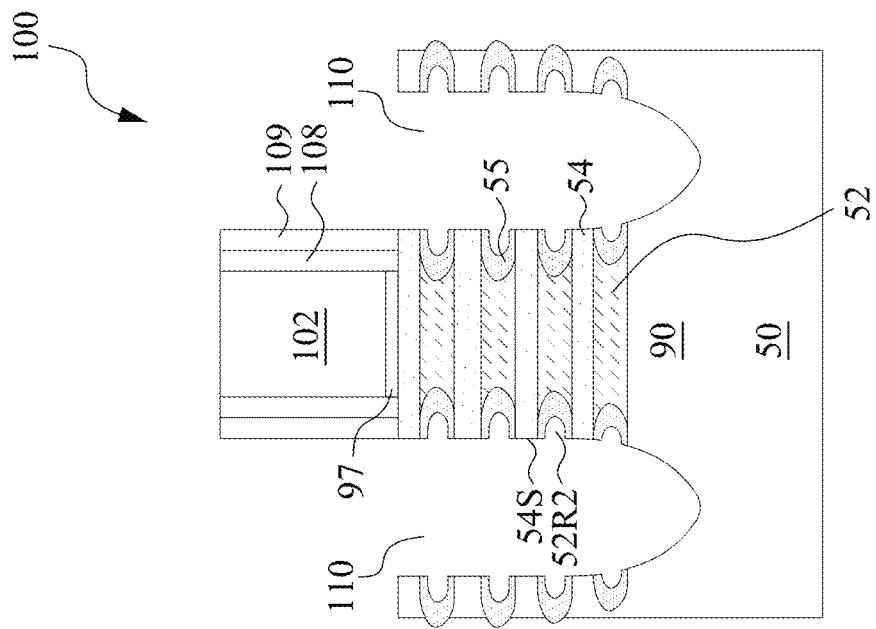
Figure 12B:
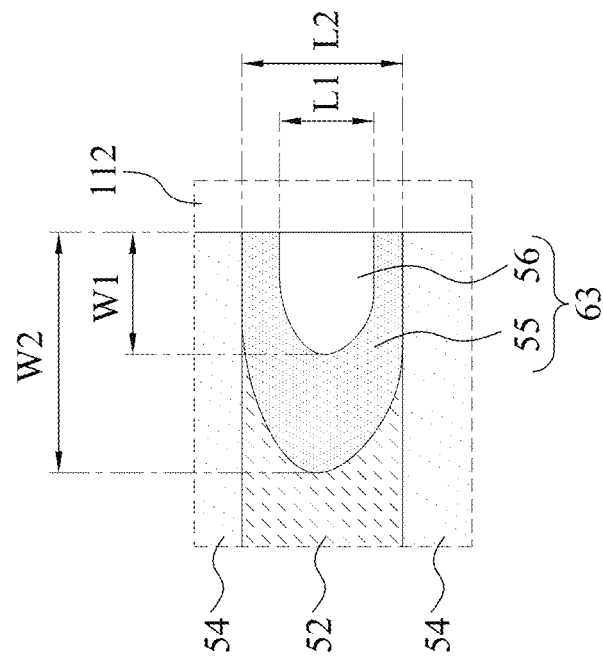

Next, in FIG. 11, an etching process, which may be a pre-cleaning process for the subsequent epitaxial process to form the source/drain regions 112, is performed. In the illustrated embodiment, the etching process selectively removes the remaining portions of the second dielectric layer 57. After the etching process, the remaining portions of the first dielectric layer 55 (e.g., portions inside the first sidewall recess 52R1) form inner spacers 55.

In FIG. 11, the inner spacers 55 extend along and contact sidewalls of the recessed first semiconductor material 52. The inner spacers 55 have curved sidewalls that are recessed from the sidewall 54S of the second semiconductor material 54, and therefore, recesses 52R2 (also referred to as sidewall recesses 52R2 or second sidewall recesses 52R2) are formed. Note that in the illustrated embodiment, the second sidewall recesses 52R2 are larger than the recesses 57R (see FIG. 10), but smaller than the first sidewall recesses 52R1 (see FIG. 8). In the example of FIG. 11, the second dielectric layer 57 is completely removed by the etching process. In other embodiments, after the etching process, a thin layer of second dielectric layer 57 (e.g., with a thickness less than about 1 nm) remains over the inner spacers 55. These and other variations are fully intended to be included within the scope of the present disclosure.

In some embodiments, the etching process (e.g., a selective etching process) to remove the remaining portions of the second dielectric layer 57 is a dry etch process performed using a gas source comprising nitrogen trifluoride (NF$_3$), ammonia (NH$_3$), hydrogen fluoride (HF), combinations thereof, or the like. The gas source may further include a carrier gas such as an inert gas. For example, the etching process may be performed using a gas source comprising HF and a carrier gas (e.g., N$_2$, Ar). A mixing ratio (e.g., a volume ratio) between HF and the carrier gas may be about 1:100, and the etching process may be performed for a duration of about 60 seconds. An etch rate of 15 angstroms or more per minute, and an etching selectivity of 10 or more may be achieve by the etching process. In other words, during the selective etching process, an etch rate for the second dielectric layer 57 may be 10 times or more higher than an etch rate for the first dielectric layer 55.

Figure 12A:
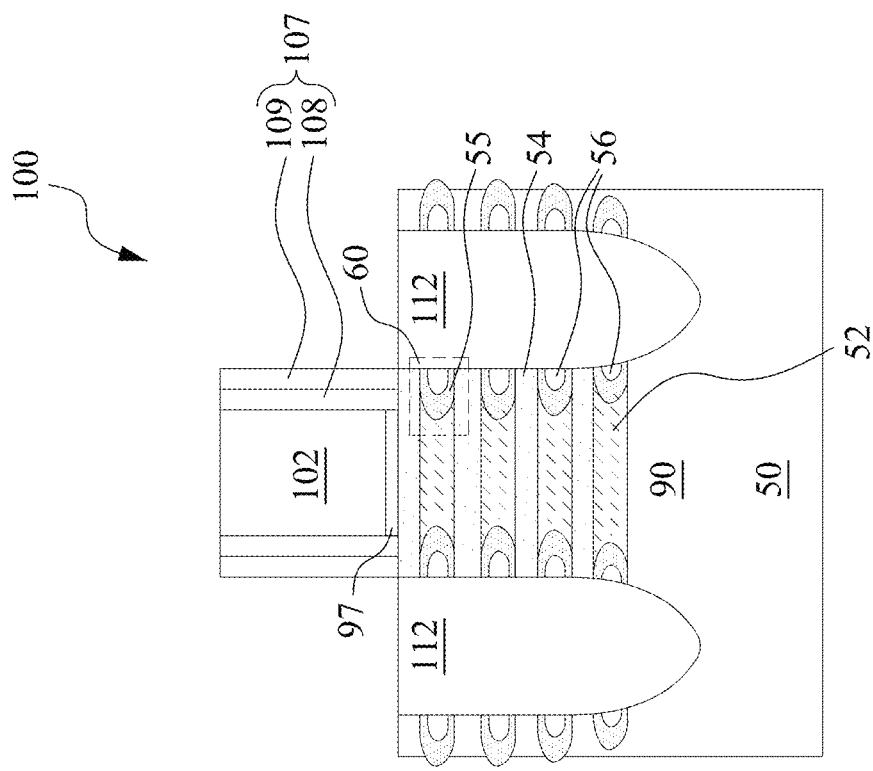

Next, in FIG. 12A, source/drain regions 112 are formed in the openings 110. As illustrated in FIG. 12A, the source/drain regions 112 fill the openings 110, and seal the second sidewall recesses 52R2 to form air gaps 56. The air gaps 56 are enclosed cavities (or enclosed spaces) disposed between the source/drain regions 112 and respective inner spacers 55, in some embodiments. In the example of FIGS. 12A, each air gap 56 is disposed vertically between adjacent layers of the second semiconductor material 54, or between a layer of the second semiconductor material 54 and the fin 90.

In some embodiments, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that the dummy gate 102 is disposed between neighboring pairs of the epitaxial source/drain regions 112. In some embodiments, the gate spacers 107 are used to separate the epitaxial source/drain regions 112 from the dummy gate 102 by an appropriate lateral distance so that the epitaxial source/drain regions 112 do not short out subsequently formed gate of the resulting NSFET device.

The epitaxial source/drain regions 112 are epitaxially grown in the openings 110, in some embodiments. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fin 90. In some embodiments, adjacent epitaxial source/drain regions 112 disposed over adjacent fins remain separated after the epitaxy process is completed. In other embodiments, these facets cause adjacent epitaxial source/drain regions 112 disposed over adjacent fins of a same NSFET to merge.

FIG. 12B illustrates a zoomed-in view of an area 60 in FIG. 12A. As illustrated in FIG. 12B, a height L1 of the air gap 56, measured between an upper surface and a lower surface of the air gap 56, may be between about 2 nm and about 8 nm, and a width W1 of the air gap 56, measured between the source/drain region 112 and a sidewall of the air gap 56 laterally distal from the source/drain region 112, may be between about 0.5 nm and about 5.5 nm. In addition, a height L2 of the inner spacer 55, measured between an upper surface and a lower surface of the inner spacer 55, may be between about 9 nm and about 13 nm, and a width W2 of the inner spacer 55, measured between the source/drain region 112 and a sidewall of the inner spacer 55 laterally distal from the source/drain region 112, may be between about 3 nm and about 6 nm.

Each air gap 56 and a respective inner spacer 55 in FIGS. 12A and 12B are collectively referred to as an air gap spacer 63. A volume ratio between the air gap 56 and the respective air gap spacer 63 is between about 20% and about 80%. Since the dielectric constant of air is about 1, which is smaller than the dielectric constants of dielectric materials commonly used for forming inner spacers, having the air gap 56 in the air gap spacer 63 reduces the overall (e.g., average) dielectric constant of the air gap spacer 63, which advantageously reduces the parasitic capacitance of the device formed. For example, compared with a reference design where the air gap spacer 63 is replaced with an inner spacer of same size but formed of a single layer of SiCN (which has a dielectric constant of about 7.0), a 5%~10% reduction in the parasitic capacitance is achieved. In some embodiments, an overall (e.g., average) dielectric constant of the air gap spacer 63 is between about 2.0 and about 4.5.

By filling the sidewall recesses 52R1 with a multi-layer spacer film 58, the disclosed embodiments achieve a balance between dielectric constant and etch resistance. To appreciate the advantage of the presently disclosed embodiments, consider two reference designs, where the first reference design uses a single layer of dielectric material with a relatively low dielectric constant (e.g., SiCON, SiON, or SiO) to fill the sidewall recesses 52R1 and then etches the single layer to form the inner spacers, and the second reference design uses a single layer of dielectric material with a relatively high dielectric constant (e.g., SiCN, or SiN) to fill the sidewall recesses 52R1 and then etches the single layer to form the inner spacers. Although the first reference design may achieve a lower dielectric constant for the inner spacers, the inner spacers may be easily damaged, e.g., by over-etch, during the etching process due to the high etch rate for the dielectric materials with low dielectric constants. The second reference design may form physically strong (e.g., dense) inner spacers, but may suffer from high dielectric constant. The presently disclosed embodiments, by using the multi-layer spacer film 58, achieves reduced dielectric constant for the air gap spacer 63 due to the air gap 56 formed by removing the second dielectric layer 57 from the sidewall recesses 52R1. At the same time, strong (e.g., denser) inner spacers are formed by the dielectric material of the first dielectric layer 55.

Figure 13:
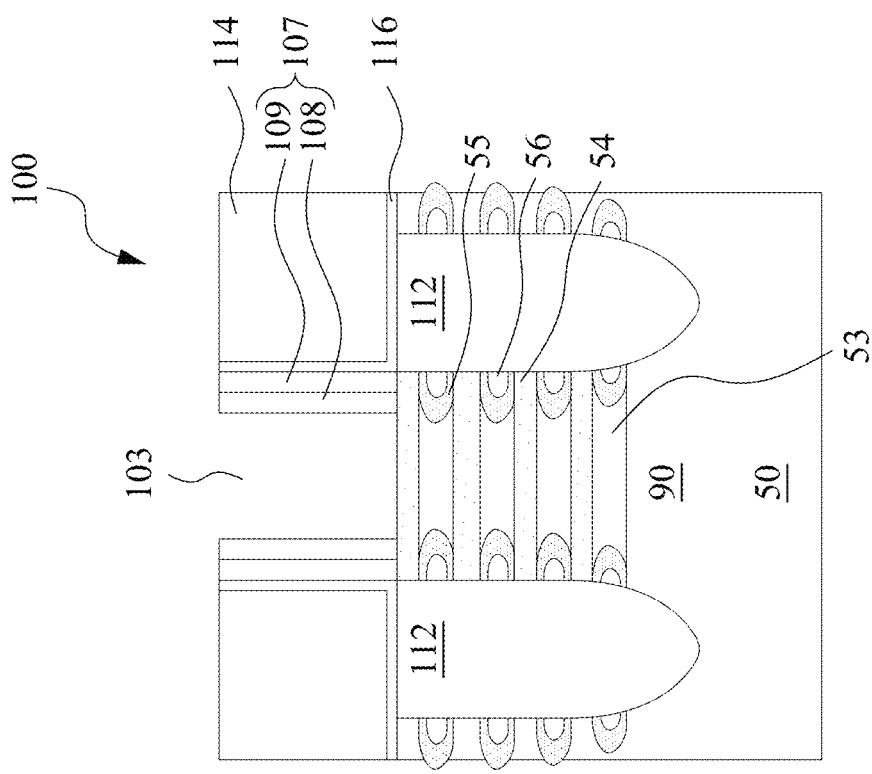

Next, in FIG. 13, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used.

Next, the dummy gate 102 is removed. To remove the dummy gate 102, a planarization process, such as a CMP, may be performed to level the top surfaces of the first ILD 114 and CESL 116 with the top surfaces of the dummy gate 102 and gate spacers 107. The planarization process may also remove the masks 104 (see FIG. 5A) on the dummy gates 102 (if the mask 104 has not been removed by the anisotropic etching process to form the gate spacers 107), and portions of the gate spacers 107 along sidewalls of the masks 104. After the planarization process, top surfaces of the dummy gate 102, gate spacers 107, and first ILD 114 are level. Accordingly, the top surface of the dummy gate 102 is exposed at the upper surface of the first ILD 114.

After the planarization process, the dummy gate 102 is removed in an etching step(s), so that a recess 103 (may also be referred to as an opening 103) is formed between the gate spacers 107. In some embodiments, the dummy gate 102 is removed by an anisotropic dry etch process. For example, the etching process may include a dry etch process using reaction gas(es) that selectively etch the dummy gate 102 without etching the first ILD 114 or the gate spacers 107. The recess 103 exposes the channel regions of the NSFET. The channel regions are disposed between neighboring pairs of the epitaxial source/drain regions 112. During the removal of the dummy gate 102, the dummy gate dielectric 97 may be used as an etch stop layer when the dummy gate 102 is etched. The dummy gate dielectric 97 may then be removed after the removal of the dummy gate 102. After removal of the dummy gate 102, the first semiconductor material 52 and the second semiconductor material 54 that were disposed under the dummy gate 102 are exposed by the recess 103.

Next, the first semiconductor material 52 is removed to release the second semiconductor material 54. After the first semiconductor material 52 is removed, the second semiconductor material 54 forms a plurality of nanosheets 54 that extend horizontally (e.g., parallel to a major upper surface of the substrate 50). The nanosheets 54 may be collectively referred to as the channel regions or the channel layers of the NSFET device 100 formed. As illustrated in FIG. 13, gaps 53 (e.g., empty spaces) are formed between the nanosheets 54 by the removal of the first semiconductor material 52. The nanosheets 54 may also be referred to as nanowires, and the NSFET device 100 may also be referred to as a gate-all-around (GAA) device, in some embodiments.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In an embodiment, an isotropic etching process is performed to remove the first semiconductor material 52. The isotropic etching process may be performed using an etching gas, and optionally, a carrier gas. In some embodiments, the etching gas comprises HF, a mixture of $F_2$ and HF, or the like, and the carrier gas may be an inert gas such as Ar, He, $N_2$, combinations thereof, or the like. In some embodiments, an etchant such as dissolved ozone in de-ionized water (DIO) is used to selectively remove the first semiconductor material 52.

Figure 14:
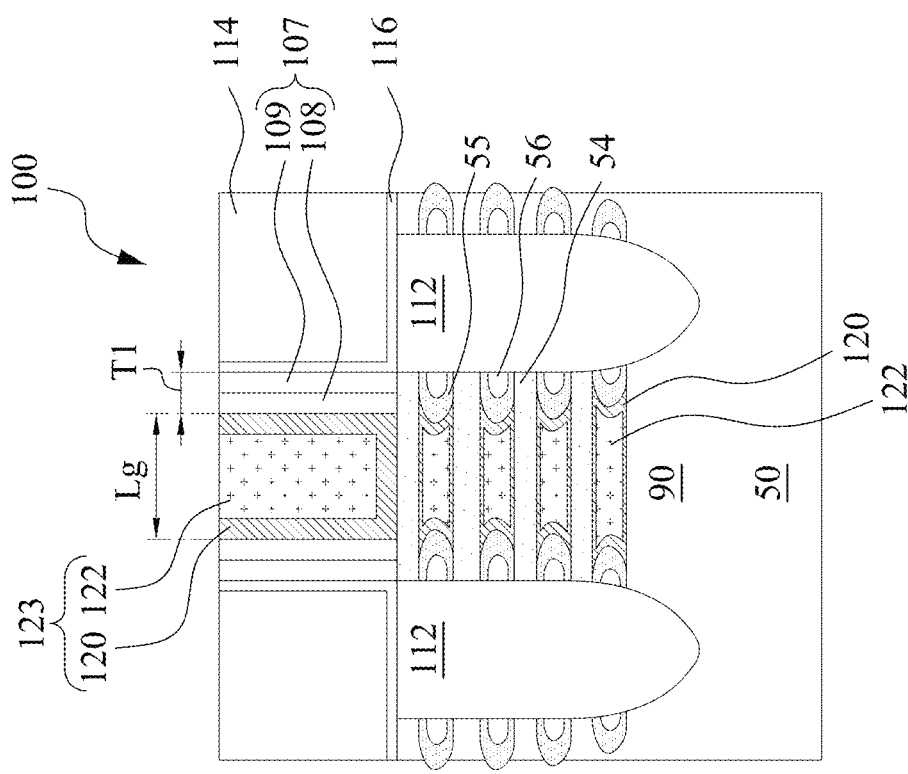

Next, in FIG. 14, a gate dielectric layer 120 is formed (e.g., conformally) in the recess 103 and in the gaps 53. The gate dielectric layer 120 wraps around the nanosheets 54, lines sidewalls of the inner spacers 55 and sidewalls of the gate spacers 107, and extends along the upper surface and sidewalls of the fin 90. In accordance with some embodiments, the gate dielectric layer 120 comprises silicon oxide, silicon nitride, or multilayers thereof. In some embodiments, the gate dielectric layer 120 includes a high-k dielectric material, and in these embodiments, the gate dielectric layer 120 may have a dielectric constant greater than about 7.0, and may include a metal oxide or a silicate of Hf, Al, Zr, La, Mg, Ba, Ti, or Pb, or combinations thereof. The formation methods of the gate dielectric layer 120 may include Molecular-Beam Deposition (MBD), ALD, PECVD, and the like.

Next, a gate electrode material (e.g., an electrically conductive material) is formed in the recess 103 and gaps 53 to form the gate electrode 122. The gate electrode 122 fills the remaining portions of the recess 103 and the gaps 53. The gate electrode 122 may be made of a metal-containing material such as Cu, Al, W, the like, combinations thereof, or multi-layers thereof, and may be formed by, e.g., electroplating, electroless plating, or other suitable method. After the filling of the gate electrodes 122, a planarization process, such as a CMP, may be performed to remove the excess portions of the gate dielectric layer 120 and the material of the gate electrodes 122, which excess portions are over the top surface of the first ILD 114. The remaining portions of material of the gate electrode 122 and the gate dielectric layer 120 thus form replacement gate of the resulting NSFET device 100. The gate electrode 122 and the corresponding gate dielectric layer 120 may be collectively referred to as a gate stack 123, a replacement gate structure 123, or a metal gate structure 123. Each gate stack 123 extends over and around the respective nanosheets 54.

Although the gate electrode 122 is illustrated as a single layer in the example of FIG. 14, one skilled in the art will readily appreciate that the gate electrode 122 may have a multi-layered structure and may include a plurality layers, such as a barrier layer, a work function layer, a seed layer and a fill metal.

For example, a barrier layer may be formed conformally over the gate dielectric layer 120. The barrier layer may comprise an electrically conductive material such as titanium nitride, although other materials, such as tantalum nitride, titanium, tantalum, or the like, may alternatively be utilized. A work function layer may be formed over the barrier layer. Exemplary p-type work function materials (may also be referred to as p-type work function metals) include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function materials (may also be referred to as n-type work function metals) include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the work function layer is chosen to tune its work function value so that a target threshold voltage $V_{TH}$ is achieved in the device that is to be formed. Next, a seed layer may be formed over the work function layer. The seed layer may be formed of tungsten, copper, or copper alloys, although other suitable materials may alternatively be used. Once the seed layer has been formed, the fill metal may be formed onto the seed layer, filling the openings 103 and gaps 53. The fill metal may comprise tungsten, although other suitable materials such as aluminum, copper, tungsten nitride, ruthenium, silver, gold, rhodium, molybdenum, nickel, cobalt, cadmium, zinc, alloys of these, combinations thereof, and the like, may alternatively be utilized.

Still referring to FIG. 14, a channel length Lg of the NSFET device 100 is between about 14 nm and about 17 nm, in some embodiments. A thickness T1 of the gate spacer 107 is between about 3.5 nm and about 5 nm, in some embodiments. A dielectric constant (e.g., an overall dielectric constant) of the gate spacer 107 is between about 4.0 and 5.5, in some embodiments.

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed extending through the second ILD and/or the first ILD 114 to electrically couple to the gate electrode 122 and the source/drain regions 112, respectively.

Variations of the disclosed embodiments are possible and are fully intended to be included within the scope of the present disclosure. For example, depending on the type of device (e.g., n-type or p-type device) formed, the second semiconductor material 54 may be removed, and the first semiconductor material 52 may remain to form the nanosheets to function as the channel regions of the NSFET device formed. In embodiments where the first semiconductor material 52 remain to form the nanosheets, inner spacers 55 are formed along the end portions of the second semiconductor material 54 before the second semiconductor material 54 is removed, as one of ordinary skill readily appreciates.

Embodiments may achieve advantages. The disclosed method or structure reduces the parasitic capacitance of the NSFET device formed by forming air gaps 56 between the inner spacers 55 and the source/drain regions 112. In addition, the inner spacers 55 are formed of physically strong (e.g., dense) material(s) that are resistant to the etching process to form the inner spacers 55. As a result, a good balance between dielectric constant and etch resistance is achieved.

Figure 15:
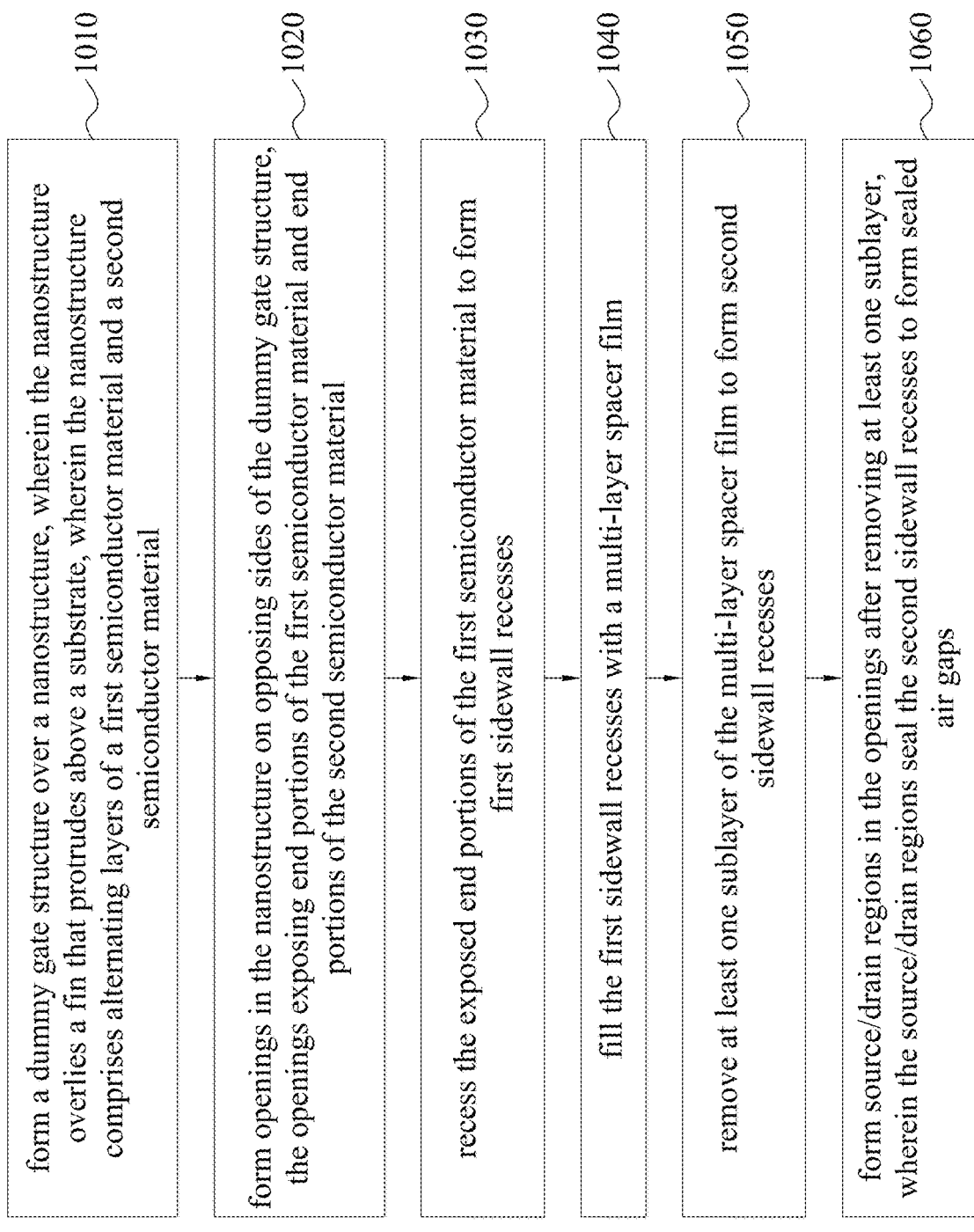
FIG. 15 is a flow chart of a method of forming a semiconductor device, in some embodiments.

FIG. 15 illustrates a flow chart of a method of fabricating a semiconductor device, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 15 may be added, removed, replaced, rearranged, or repeated.

Referring to FIG. 15, at block 1010, a dummy gate structure is formed over a nanostructure, wherein the nanostructure overlies a fin that protrudes above a substrate, wherein the nanostructure comprises alternating layers of a first semiconductor material and a second semiconductor material. At block 1020, openings are formed in the nanostructure on opposing sides of the dummy gate structure, the openings exposing end portions of the first semiconductor material and end portions of the second semiconductor material. At block 1030, the exposed end portions of the first semiconductor material are recessed to form first sidewall recesses. At block 1040, the first sidewall recesses are filled with a multi-layer spacer film. At block 1050, at least one sublayer of the multi-layer spacer film is removed to form second sidewall recesses. At block 1060, source/drain regions are formed in the openings after removing at least one sublayer, wherein the source/drain regions seal the second sidewall recesses to form sealed air gaps.

In an embodiment, a method of forming a semiconductor device includes: forming a dummy gate structure over a nanostructure, wherein the nanostructure overlies a fin that protrudes above a substrate, wherein the nanostructure comprises alternating layers of a first semiconductor material and a second semiconductor material; forming openings in the nanostructure on opposing sides of the dummy gate structure, the openings exposing end portions of the first semiconductor material and end portions of the second semiconductor material; recessing the exposed end portions of the first semiconductor material to form first sidewall recesses; filling the first sidewall recesses with a multi-layer spacer film; removing at least one sublayer of the multi-layer spacer film to form second sidewall recesses; and forming source/drain regions in the openings after removing at least one sublayer, wherein the source/drain regions seal the second sidewall recesses to form sealed air gaps. In an embodiment, the multi-layer spacer film comprises a first dielectric layer and a second dielectric layer, wherein the second dielectric layer and the first dielectric layer comprise different dielectric materials, wherein filling the first sidewall recesses comprises: conformally forming the first dielectric layer in the openings and in the first sidewall recesses; and forming the second dielectric layer in the openings over the first dielectric layer to fill the first sidewall recesses. In an embodiment, the first dielectric layer is formed of SiCN, SiN, or SiCON, and the second dielectric layer is formed of SiCON, SiON, or SiCO. In an embodiment, the first dielectric layer has a first dielectric constant, and the second dielectric layer has a second dielectric constant smaller than the first dielectric constant. In an embodiment, the first dielectric layer has a first atomic percentage of oxygen, and the second dielectric layer has a second atomic percentage of oxygen higher than the first atomic percentage of oxygen. In an embodiment, removing at least one sublayer of the multi-layer spacer film comprises: performing a first etching process to remove first portions of the first dielectric layer and first portions of the second dielectric layer disposed outside the first sidewall recesses; and after performing the first etching process, performing a second etching process using an etchant selective to the second dielectric layer, wherein after the second etching process, remaining portions of the first dielectric layer form inner spacers. In an embodiment, a second etch rate of the second dielectric layer for the etchant is ten times or more than a first etch rate of the first dielectric layer for the etchant. In an embodiment, the first etching process is a first dry etch process, and the second etching process is a second dry etch process, wherein the first dry etch process and the second dry etch process are performed using different etching gases. In an embodiment, the second etching process is performed using a gas comprising $NF_3$, $NH_3$, or HF. In an embodiment, the method further includes: after forming the source/drain regions, removing the dummy gate structure to expose the first semiconductor material and the second semiconductor material disposed under the dummy gate structure; removing the exposed first semiconductor material, wherein after removing the exposed first semiconductor material, the second semiconductor material remains and forms a plurality of nanosheets; and forming a metal gate structure around the plurality of nanosheets. In an embodiment, forming the metal gate structure comprises: conformally forming a gate dielectric material around the plurality of nanosheets; and forming an electrically conductive material on the gate dielectric material around the plurality of nanosheets.

In an embodiment, a method of forming a semiconductor device includes: forming a first gate structure over a nanostructure, wherein the nanostructure comprises layers of a first semiconductor material interleaved with layers of a second semiconductor material, wherein the nanostructure is disposed over a fin; forming recesses in the nanostructure on opposing sides of the first gate structure; removing portions of the first semiconductor material exposed by the recesses to form first sidewall recesses; filling the first sidewall recesses with a multi-layer spacer film, wherein the multi-layered spacer film comprises a first spacer layer and a second spacer layer that are formed of different materials; removing the second spacer layer from the first sidewall recesses, wherein after removing the second spacer layer, portions of the first spacer layer in the first sidewall recesses form inner spacers; and forming source/drain regions in the recesses, wherein air gaps are enclosed by the source/drain regions and the inner spacers. In an embodiment, the first spacer layer is formed of a first dielectric material, and the second spacer layer is formed of a second dielectric material, wherein a first dielectric constant of the first dielectric material is higher than a second dielectric constant of the second dielectric material. In an embodiment, the first spacer layer is formed in the first sidewall recesses and in physical contact with the first semiconductor material, wherein the second spacer layer is separated from the first semiconductor material by the first spacer layer. In an embodiment, an atomic percentage of oxygen in the first spacer layer is lower than an atomic percentage of oxygen in the second spacer layer. In an embodiment, removing the second spacer layer comprises performing a selectively etching process to remove the second spacer layer.

In an embodiment, a method of forming a semiconductor device includes: forming a nanostructure over a fin, the fin protruding above a substrate, the nanostructure comprising alternating layers of a first semiconductor material and a second semiconductor material; forming a first gate structure over the nanostructure; forming source/drain openings extending into the nanostructure on opposing sides of the first gate structure; recessing portions of the first semiconductor material exposed by the source/drain openings to form first sidewall recesses; conformally forming a first spacer layer in the source/drain openings and in the first sidewall recesses; forming a second spacer layer over the first spacer layer, the second spacer layer filling the first sidewall recesses; performing a trimming process to remove first portions of the first spacer layer and first portions of the second spacer layer disposed outside the first sidewall recesses; after performing the trimming process, performing a cleaning process, wherein the cleaning process removes second portions of the second spacer layer disposed in the first sidewall recesses, wherein after the cleaning process, remaining portions of the first spacer layer in the first sidewall recesses form inner spacers; and forming source/drain regions in the source/drain openings, wherein the source/drain regions seal air gaps between the source/drain regions and the inner spacers. In an embodiment, the first spacer layer is formed of a first dielectric material having a first dielectric constant, and the second spacer layer is formed of a second dielectric material having a second dielectric constant, wherein the second dielectric constant is smaller than the first dielectric constant. In an embodiment, performing the cleaning process comprises performing a selective etching process using an etchant that has a higher etch rate for the second spacer layer than the first spacer layer. In an embodiment, the method further includes: forming a dielectric layer around the first gate structure; removing the first gate structure to expose the first semiconductor material and the second semiconductor material disposed under the first gate structure; selectively removing the first semiconductor material, wherein after selectively removing the first semiconductor material, the second semiconductor material remains and forms nanosheets; and forming a replacement gate structure around and over the nanosheets.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a gate structure over a nanostructure, wherein the nanostructure overlies a fin and comprises alternating layers of a first semiconductor material and a second semiconductor material;
   forming openings in the nanostructure on opposing sides of the gate structure to expose the first semiconductor material and the second semiconductor material;
   recessing portions of the first semiconductor material exposed by the openings to form first sidewall recesses in the first semiconductor material;
   filling the first sidewall recesses by successively forming a first dielectric layer and a second dielectric layer different from the first dielectric layer in the first sidewall recesses;
   performing a first etching process to remove first portions of the first dielectric layer and first portions of the second dielectric layer disposed outside the first sidewall recesses; and
   after performing the first etching process, performing a second etching process to selectively remove the second dielectric layer, wherein the first etching process is a first dry etch process, and the second etching process is a second dry etch process performed using a different etching gas.

2. The method of claim 1, further comprising, after performing the second etching process, forming source/drain regions in the openings.

3. The method of claim 2, wherein performing the second etching process forms second sidewall recesses in the first semiconductor material, wherein the source/drain regions seal the second sidewall recesses to form sealed air gaps.

4. The method of claim 2, further comprising, after forming the source/drain regions:
removing the gate structure to expose the first semiconductor material and the second semiconductor material disposed under the gate structure;
selectively removing the exposed first semiconductor material, wherein after selectively removing the exposed first semiconductor material, the second semiconductor material remains and forms a plurality of nanosheets; and
forming a replacement gate structure around the plurality of nanosheets.

5. The method of claim 4, wherein forming the replacement gate structure comprises:
forming a gate dielectric material around the plurality of nanosheets; and
forming a gate electrode material around the gate dielectric material and the plurality of nanosheets.

6. The method of claim 1, wherein the first etching process is performed using a gas source comprising a mixture of $CHF_3$ and $O_2$, a mixture of $CF_4$ and $O_2$, or a mixture of $NF_3$, $CH_3F$, and CHF.

7. The method of claim 6, wherein the second etching process is performed using a gas source comprising $NF_3$, $NH_3$, or HF.

8. The method of claim 1, wherein the first dielectric layer has a higher dielectric constant than the second dielectric layer.

9. The method of claim 1, wherein a first atomic percentage of oxygen in the first dielectric layer is lower than a second atomic percentage of oxygen in the second dielectric layer.

10. The method of claim 1, wherein the second dielectric layer is removed by the second etching process ten times or more faster than the first dielectric layer.

11. A method of forming a semiconductor device, the method comprising:
forming a gate structure over a nanostructure, wherein the nanostructure comprises layers of a first semiconductor material interleaved with layers of a second semiconductor material;
forming openings in the nanostructure on opposing sides of the gate structure;
removing portions of the first semiconductor material exposed by the openings to form sidewall recesses;
lining the openings and the sidewall recesses with a multi-layer spacer film, wherein the multi-layered spacer film comprises a first spacer layer and a second spacer layer different from the first spacer layer;
performing a first dry etch process to remove first portions of the first spacer layer and first portions of the second spacer layer that are disposed outside the sidewall recesses; and
after performing the first dry etch process, performing a second dry etch process to remove the second spacer layer from the sidewall recesses, wherein the first dry etch process and the second dry etch process are performed using different etchants.

12. The method of claim 11, wherein the second dry etch process selectively removes the second spacer layer.

13. The method of claim 11, wherein after performing the second dry etch process, remaining portions of the first spacer layer in the sidewall recesses form inner spacers.

14. The method of claim 11, further comprising, after performing the second dry etch process, forming source/drain regions in the openings, wherein the source/drain regions seal the sidewall recesses to form sealed air gaps.

15. The method of claim 11, wherein the first spacer layer is formed in the sidewall recesses and contacts the first semiconductor material, wherein the second spacer layer is separated from the first semiconductor material by the first spacer layer.

16. A method of forming a semiconductor device, the method comprising:
forming a nanostructure over a fin, the nanostructure comprising alternating layers of a first semiconductor material and a second semiconductor material;
forming a first gate structure over the nanostructure;
forming source/drain openings extending into the nanostructure on opposing sides of the first gate structure;
recessing portions of the first semiconductor material exposed by the source/drain openings to form first sidewall recesses;
lining the source/drain openings and the first sidewall recesses by successively forming a first spacer layer and a second spacer layer in the source/drain openings and the first sidewall recesses;
performing a trimming process, wherein the trimming process removes first portions of the first spacer layer and first portions of the second spacer layer disposed outside the first sidewall recesses, wherein the trimming process is an etching process performed using a first etchant; and
after performing the trimming process, performing a cleaning process, wherein the cleaning process removes second portions of the second spacer layer disposed in the first sidewall recesses, wherein the cleaning process is a dry etch process performed using a second etchant different from the first etchant.

17. The method of claim 16, wherein the trimming process is another dry etch process different from the dry etch process of the cleaning process.

18. The method of claim 17, wherein the first etchant is a first etching gas, and the second etchant is a second etching gas different from the first etching gas.

19. The method of claim 16, wherein the first spacer layer is formed of a first dielectric material having a first dielectric constant, and the second spacer layer is formed of a second dielectric material having a second dielectric constant smaller than the first dielectric constant.

20. The method of claim 16, further comprising, after performing the cleaning process:
forming source/drain regions in the source/drain openings, wherein air gaps are formed between the source/drain regions and remaining portions of the first spacer layer in the first sidewall recesses.

* * * * *